(12) United States Patent
Sugiyama et al.

(10) Patent No.: US 9,484,372 B2
(45) Date of Patent: Nov. 1, 2016

(54) SUBSTRATE FOR EMBEDDING IMAGING DEVICE AND METHOD FOR MANUFACTURING SAME, AND IMAGING APPARATUS

(71) Applicant: TAIYO YUDEN CO., LTD., Tokyo (JP)

(72) Inventors: Yuichi Sugiyama, Tokyo (JP); Masashi Miyazaki, Tokyo (JP); Yoshiki Hamada, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 14/960,094

(22) Filed: Dec. 4, 2015

(65) Prior Publication Data
US 2016/0163751 A1 Jun. 9, 2016

(30) Foreign Application Priority Data
Dec. 5, 2014 (JP) ................................ 2014-246564

(51) Int. Cl.
*H01L 31/0203* (2014.01)
*H01L 27/146* (2006.01)

(52) U.S. Cl.
CPC ..... *H01L 27/14618* (2013.01); *H01L 27/14627* (2013.01); *H01L 31/0203* (2013.01)

(58) Field of Classification Search
CPC .................... H01L 31/0203; H01L 27/14618
See application file for complete search history.

(56) References Cited

U.S. PATENT DOCUMENTS

| 5,673,083 A * | 9/1997 | Izumi | H04N 5/2253 348/335 |
|---|---|---|---|
| 7,626,621 B2 * | 12/2009 | Ito | H04N 5/2253 348/294 |
| 9,349,764 B1 * | 5/2016 | Lee | H01L 27/14618 |
| 2001/0040639 A1 * | 11/2001 | Iwasaki | H01L 27/14601 348/374 |
| 2004/0069998 A1 * | 4/2004 | Harazono | H01L 27/14618 257/81 |
| 2009/0115875 A1 * | 5/2009 | Choi | H01L 27/14618 348/294 |
| 2010/0200898 A1 * | 8/2010 | Lin | H01L 27/14618 257/294 |
| 2012/0217607 A1 * | 8/2012 | Hanai | H01L 27/14618 257/448 |
| 2012/0294602 A1 * | 11/2012 | Sekine | H01L 27/14618 396/502 |
| 2013/0075849 A1 * | 3/2013 | Suzuki | H01L 27/14605 257/432 |

FOREIGN PATENT DOCUMENTS

| JP | 2001-284564 A | 10/2001 |
|---|---|---|
| JP | 2004-63776 A | 2/2004 |
| JP | 4604307 B2 | 1/2011 |

* cited by examiner

*Primary Examiner* — Asok K Sarkar
*Assistant Examiner* — Grant Withers
(74) *Attorney, Agent, or Firm* — Chen Yoshimura LLP

(57) ABSTRACT

A substrate for embedding an imaging device includes: a core layer; a first multilayered wiring layer that is formed onto the core layer, the core layer and the first multilayered wiring layer having a cavity penetrating therethrough; a second multilayered wiring layer that is formed onto the core layer on a side opposite to the first multilayered wiring layer and that includes a conductive pattern formed at a position facing the cavity; a resin portion that is arranged inside the cavity and includes a bottom surface supported by the second multilayered wiring layer, a side face supported by the core layer, and a curved surface formed on a side opposite to the bottom surface; and an imaging device adhered along the curved surface inside the cavity.

8 Claims, 21 Drawing Sheets

SUBSTRATE FOR EMBEDDING IMAGING DEVICE AND METHOD FOR MANUFACTURING SAME, AND IMAGING APPARATUS

BACKGROUND OF THE INVENTION

1. Technical Field

The present invention relates to a substrate for embedding an imaging device, a method for manufacturing the same, and an imaging apparatus.

2. Background Art

As mobile computing devices such as smartphones have become thinner in recent years, the demand for thinner imaging apparatuses to build into those mobile computing devices has grown. Patent Documents 1 to 3 disclose technologies for making imaging apparatuses thinner. These technologies aim to make the imaging devices and lens units built into the imaging apparatuses thinner.

More specifically, in these technologies a thin imaging device is used, and the imaging device is curved according to the aberration of the lens unit. Curving the imaging device removes the need to provide a lens for correcting the aberration in the lens unit, for example, thereby making it possible to make the lens unit thinner.

RELATED ART DOCUMENTS

Patent Documents

Patent Document 1: Japanese Patent No. 04604307
Patent Document 2: Japanese Patent Application Laid-Open Publication No. 2004-063776
Patent Document 3: Japanese Patent Application Laid-Open Publication No. 2001-284564

SUMMARY OF THE INVENTION

Although the imaging devices disclosed in the abovementioned patent documents are thin, curving the imaging devices increases the dimensions of those imaging apparatuses in the thickness direction of the imaging apparatus. In other words, technologies in which the imaging device is curved make it possible to make the lens unit thinner, but the imaging device itself increases the thickness of the overall imaging apparatus.

The present invention was made in view of the abovementioned problem and aims to provide a substrate for embedding an imaging device with a built-in curved imaging device, a method for manufacturing the same, and an imaging apparatus. Accordingly, the present invention is directed to a scheme that substantially obviates one or more of the above-discussed and other problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a substrate for embedding an imaging device, including: a core layer; a first multilayered wiring layer that is formed onto the core layer, the core layer and the first multilayered wiring layer having a cavity penetrating therethrough; a second multilayered wiring layer that is formed onto the core layer on a side opposite to the first multilayered wiring layer and that includes a conductive pattern formed at a position facing the cavity; a resin portion that is arranged inside the cavity and includes a bottom surface supported by the second multilayered wiring layer, a side face supported by the core layer, and a curved surface formed on a side opposite to the bottom surface; and an imaging device adhered along the curved surface inside the cavity.

In this configuration, the imaging device is fully housed within the cavity, and therefore the thickness of the substrate for embedding an imaging device does not change according to the curved shape used for the imaging device. As a result, the curved shape of the imaging device makes it possible to make the lens unit built into the imaging apparatus thinner without increasing the thickness of the substrate for embedding an imaging device. Furthermore, in this substrate for embedding an imaging device, the core layer provides high rigidity, and therefore the substrate for embedding an imaging device is not prone to deformation due to application of forces in the thickness direction thereof because the side faces of the resin portion that supports the imaging device are supported by the core layer. In addition, in this substrate for embedding an imaging device the ground portion formed at a position facing the imaging device blocks noise originating from outside of the second multilayered wiring layer, thereby enabling the imaging device to more satisfactorily form images.

The curved surface of the resin portion may be curved towards the second multilayered wiring layer.

This configuration makes it possible to provide a substrate for embedding an imaging device appropriate for use with a lens unit having a prescribed aberration.

The imaging device may protrude out beyond the curved surface of the resin portion.

This configuration makes it possible to prevent excess adhesive from adhering to the surface of the imaging device when adhering the imaging device to the curved surface of the resin portion.

The curved surface of the resin portion may protrude out beyond the imaging device.

In this configuration, the entire bottom surface of the imaging device is supported by the curved surface of the resin portion, thereby more satisfactorily maintaining the accurate positioning and shape of the imaging device. Furthermore, in this configuration, the periphery of the imaging device is also supported by the curved surface of the resin portion, and therefore the imaging device is less prone to deformation if the periphery thereof is subjected to shocks or impacts during the wire bonding process.

The cavity may be hermetically sealed by the second multilayered wiring layer.

This configuration makes it possible to prevent foreign materials from entering the cavity from the second multilayered wiring layer side and also makes it possible to allocate a wider region for forming wires or the like in the second wiring layer.

The core layer may be made of metal, and the conductive pattern of the second multilayered wiring layer may be electrically connected to the core layer.

In another aspect, the present disclosure provides a method for manufacturing a substrate for embedding an imaging, the method including: placing, inside a cavity penetrating through a core layer, a mold having a curved surface; filling the cavity with a resin to form a resin portion having a curved surface corresponding to the curved surface of the mold; hardening the resin portion after the mold is placed and the cavity is filled with the resin; exposing the curved surface of the resin portion by removing the mold after the resin is hardened; and adhering the imaging device along the exposed curved surface of the resin portion.

This method makes it possible to easily form a resin portion having a curved surface by using the mold.

In another aspect, the present disclosure provides an imaging apparatus, including: a lens unit configured to transmit external light; a core layer that is arranged facing the lens unit; a first multilayered wiring layer that is formed onto a lens unit side of the core layer, the core layer and the first multilayered wiring layer having a cavity penetrating therethrough; a second multilayered wiring layer that is formed onto the core layer on a side opposite to the first multilayered wiring layer and that includes a conductive pattern formed at a position facing the cavity; a resin portion that is arranged inside the cavity and includes a bottom surface supported by the second multilayered wiring layer, a side face supported by the core layer, and a curved surface that is formed on a side opposite to the bottom surface and has a shape determined according to a configuration of the lens unit; and an imaging device adhered along the curved surface inside the cavity that receives the external light passing through the lens unit.

The present invention, in at least one aspect, makes it possible to provide a substrate for embedding an imaging device with a built-in curved imaging device, a method for manufacturing the same, and an imaging apparatus.

It is to be understood that both the foregoing general description and the following detailed description are exemplary and explanatory, and are intended to provide further explanation of the invention as claimed.

DETAILED DESCRIPTION OF EMBODIMENTS

Embodiments of the present invention will be described below with reference to figures.

<Imaging Apparatus 1>

Figure 1:
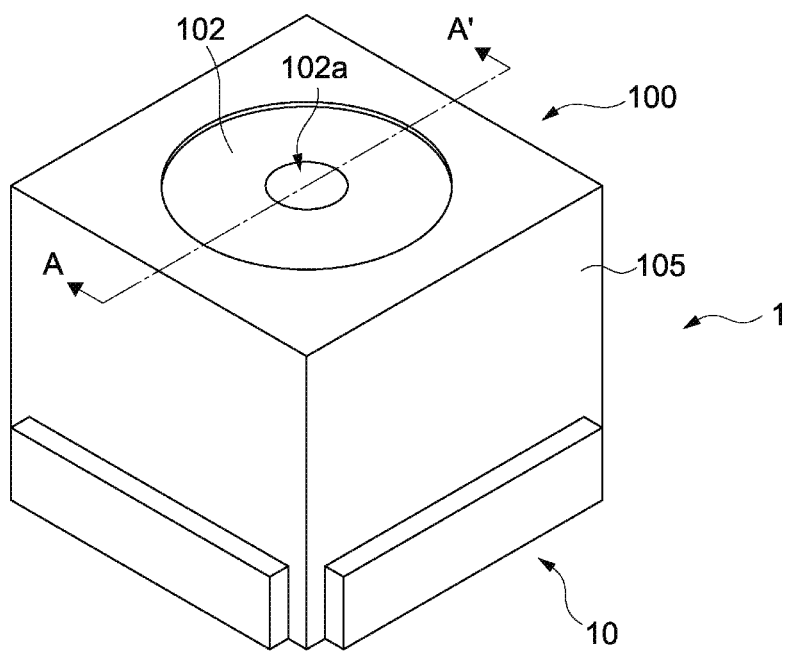
FIG. 1 is a perspective view of an imaging apparatus according to an embodiment of the present invention.
Figure 2:
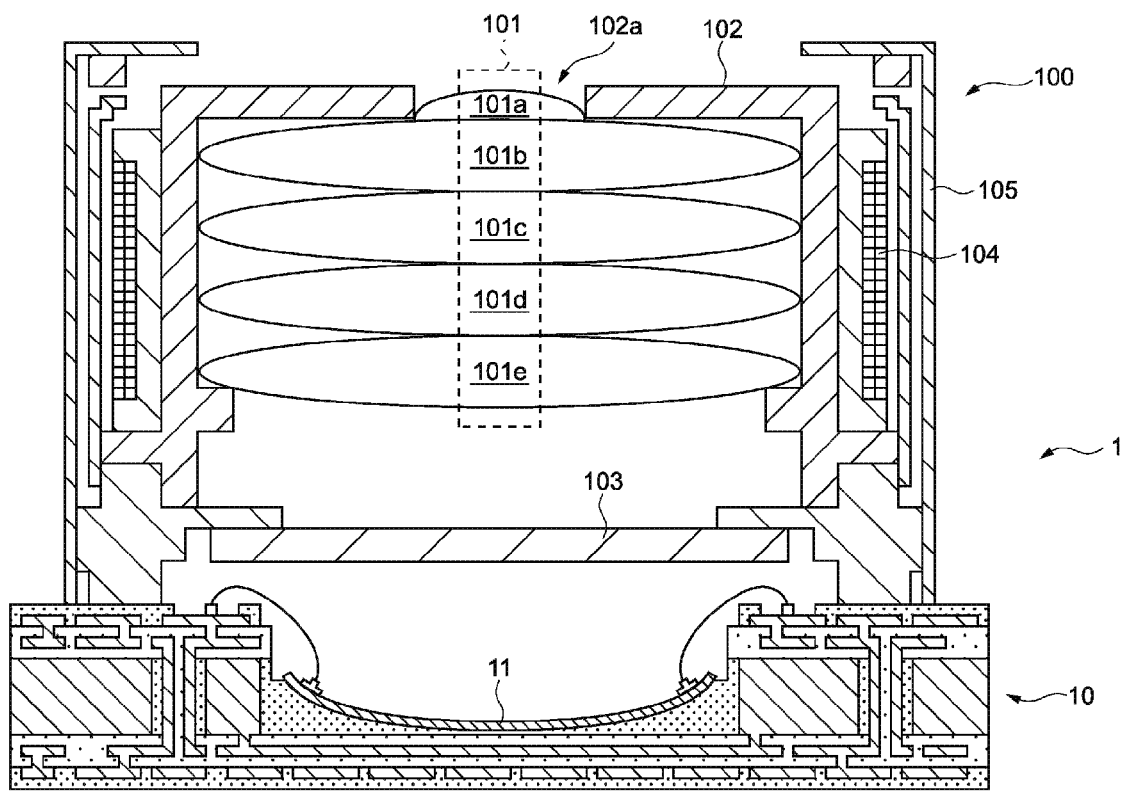
FIG. 2 is a cross-sectional view of the imaging apparatus taken along line A-A' in FIG. 1.

FIG. 1 is a perspective view of an imaging apparatus 1 according to an embodiment of the present invention. FIG. 2 is a cross-sectional view of the imaging apparatus 1 taken along line A-A' in FIG. 1. The imaging apparatus 1 may be used in a wide variety of applications but is particularly well-suited to use in electronic devices that require thin components, such as mobile computing devices like smartphones.

The imaging apparatus 1 includes a lens barrel 100 and a substrate for embedding an imaging device 10. The substrate for embedding an imaging device 10 is formed at the bottom of the lens barrel 100 and includes an imaging device 11 arranged facing towards the interior of the lens barrel 100.

The imaging device 11 used in the substrate for embedding an imaging device 10 is thin, flexible, and has a flat plate shape. It is preferable that the thickness of the imaging device 11 be less than or equal to 100 μm and more preferable that the thickness of the imaging device 11 be less than or equal to 50 μm. The imaging device 11 is curved, and the top surface of the imaging device 11, which is the sensor surface, forms a concave shape. The imaging device 11 may be a CMOS imaging device or a CCD imaging device, for example.

The lens barrel 100 includes a lens unit 101 that has five lenses 101a to 101e and a lens holder 102 that holds the lens unit 101. The lens unit 101 is arranged above and facing the imaging device 11, with the optical axes of the lenses 101a to 101e passing through the center of the imaging device 11.

Moreover, the lens barrel 100 includes an infrared cut-off filter 103 arranged between the lens unit 101 and the imaging device 11, an actuator 104 for auto-focusing, and an outer case 105 that serves as a housing.

An aperture 102a for letting in external light is formed in the lens holder 102 at the position at which the uppermost lens 101a is disposed. External light that enters the aperture 102a passes in order through the lenses 101a to 101e and the infrared cut-off filter 103 and reaches the concave-shaped sensor surface of the imaging device 11. The imaging apparatus 1 forms an image by using the imaging device 11 to detect this external light.

The configuration of the lens unit 101 and the curved shape of the imaging device 11 are determined such that the imaging device 11 can form a satisfactory image. In other words, the curved shape of the imaging device is determined appropriately according to the configuration of the lens unit 101. Moreover, the configuration of the lens unit 101 is not particularly limited, and the shapes and number of lenses used may be determined as appropriate.

For example, the imaging device 11 may be formed in a curved shape that counteracts the aberration of the lens unit 101. This results in a thinner lens unit 101 because a lens or the like for correcting aberration is not needed. Furthermore, using such a lens unit 101 removes the need to consider aberration, thereby facilitating design and resulting in a simpler configuration.

In the substrate for embedding an imaging device 10 of the present embodiment, the curved imaging device 11 is fully housed inside the substrate for embedding an imaging device 10. This keeps the substrate for embedding an imaging device 10 thin because the thickness of the substrate for embedding an imaging device 10 does not have to increase according to the curved shape used for the imaging device 11. Next, the configuration of the substrate for embedding an imaging device 10 will be described in more detail.

<Configuration of Substrate for Embedding Imaging Device 10>

(Overall Configuration)

Figure 3:
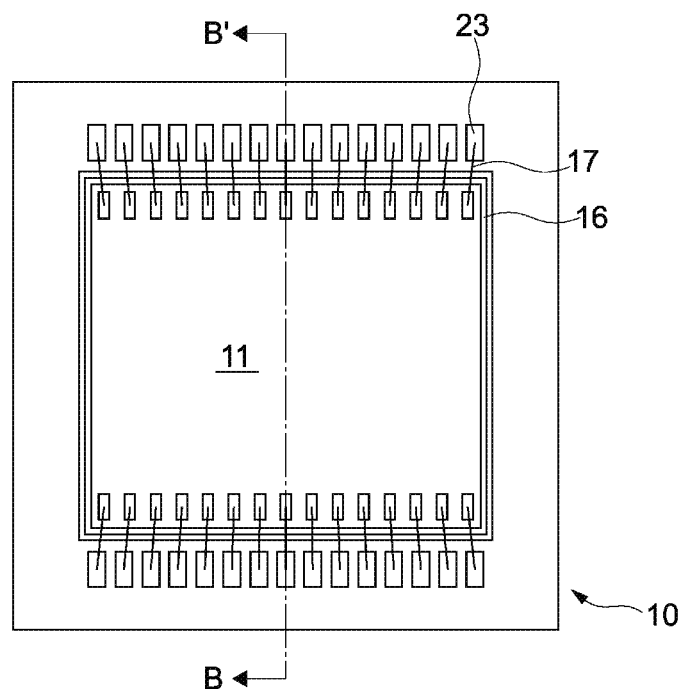
FIG. 3 is a plan view of a substrate for embedding an imaging device for the imaging apparatus.
Figure 4:
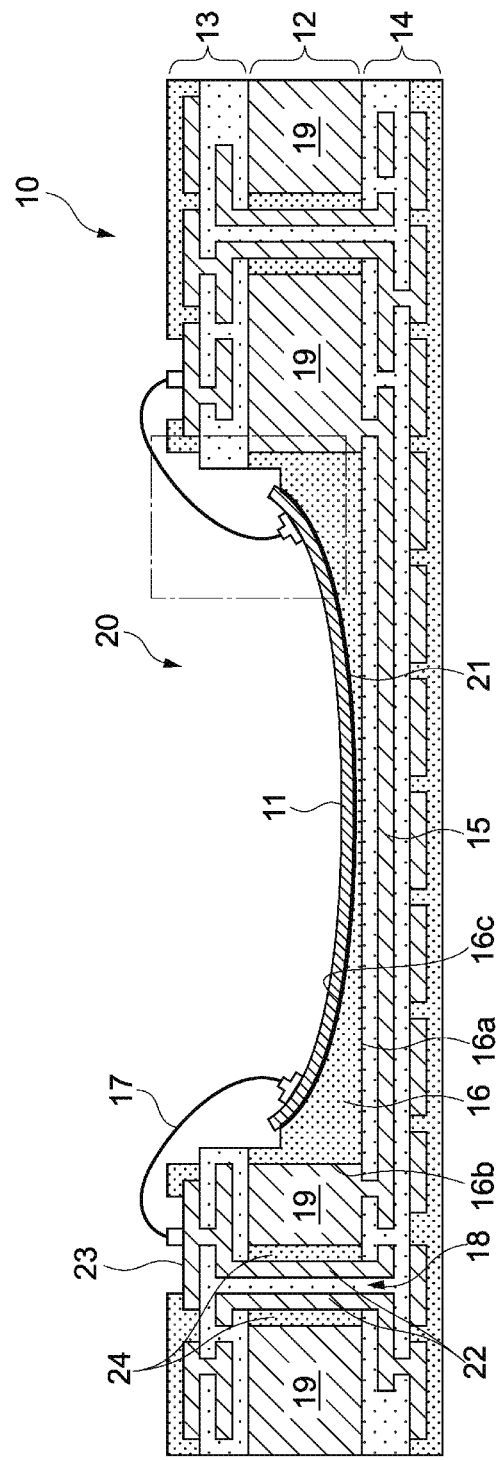
FIG. 4 is a cross-sectional view of the substrate for embedding an imaging device taken along line B-B' in FIG. 3.

FIG. 3 is a plan view of the substrate for embedding an imaging device 10 according to the present embodiment. FIG. 4 is a cross-sectional view of the substrate for embedding an imaging device 10 taken along line B-B' in FIG. 3. The substrate for embedding an imaging device 10 includes a core layer 12, a first multilayered wiring layer 13, and a second multilayered wiring layer 14. The first multilayered wiring layer 13 and the second multilayered wiring layer 14 each include conductive portions (the hatched regions in the figures) and insulating portions (the dotted regions in the figures).

The core layer 12 includes a core member 19 formed using a metal such as copper. The core member 19 functions as a base material for the core layer 12 and starts as a single continuous flat plate. The metal core member 19 gives the substrate for embedding an imaging device 10 high rigidity. The first multilayered wiring layer 13 is layered on the top surface of the core layer 12, and the second multilayered wiring layer 14 is layered on the bottom surface of the core layer 12.

A cavity 20 that goes through the core layer 12 and the first multilayered wiring layer 13 is formed in the center region of the substrate for embedding an imaging device 10. In other words, the cavity 20 has a recess shape, and the bottom surface of the cavity 20 is the top surface of the second multilayered wiring layer 14. The cavity 20 forms a space for housing the imaging device 11.

The shape of the cavity 20 is not particularly limited. Any shape may be used for the cavity 20 as long as the imaging device 11 can be housed therein. However, it is preferable that the cavity 20 be formed following an outline around the imaging device 11 and that gaps between the cavity 20 and the imaging device 11 be kept small in order to make the overall substrate for embedding an imaging device 10 smaller. In the example illustrated in FIGS. 3 and 4, the cavity 20 is formed following a rectangular outline around the imaging device 11 and has a substantially rectangular shape.

The imaging device 11 housed inside the cavity 20 is connected (wire-bonded) to top electrodes 23 on the top surface of the first multilayered wiring layer 13 using wires 17 made from a material such as gold. Furthermore, the first multilayered wiring layer 13 and the second multilayered wiring layer 14 are connected together by through-electrodes 22. The through-electrodes 22 are formed inside through-holes 18 formed in the core layer 12 and are insulated from the core member 19 by an insulating resin 24.

The second multilayered wiring layer 14 hermetically seals the cavity 20 from the bottom without any gaps therebetween. In the present embodiment, the curved imaging device 11 can be placed directly inside the cavity 20 without forming any openings or the like in the second multilayered wiring layer 14. This process will be described in more detail later. This configuration makes it possible to prevent foreign materials from entering the cavity 20 from beneath the second multilayered wiring layer 14 and also makes it possible to allocate a wider region for forming wires or the like in the second multilayered wiring layer 14.

The second multilayered wiring layer 14 includes a ground portion 15 separated from the cavity 20 by an insulating layer. The ground portion 15 is formed using a metal material that follows the bottom surface of the cavity 20 and shields the cavity 20 from noise from beneath the second multilayered wiring layer 14. The configuration of the ground portion 15 is not particularly limited. The ground portion 15 may be configured having a wire shape, a flat plate shape, or a mesh shape, for example.

Moreover, the core member 19 is electrically connected to the ground portion 15 and functions as part of the ground portion within the substrate for embedding an imaging device 10. This configuration more satisfactorily shields the cavity 20 from external noise. In this way, in the substrate for embedding an imaging device 10, the imaging device 11 inside the cavity 20 is less subject to the effects of external noise, thereby making it possible for the imaging device 11 to more satisfactorily form images.

It should be noted that the core member 19 does not necessarily have to be connected to the ground portion 15. For example, the core member 19 may function as a wire within the substrate for embedding an imaging device 10, or the core member 19 may have no electrical function in the substrate for embedding an imaging device 10.

(Internal Configuration of the Cavity 20)

The substrate for embedding an imaging device 10 includes a resin portion 16 formed supporting the imaging device 11 inside the cavity 20. The resin portion 16 includes a bottom surface 16a supported by the top surface of the second multilayered wiring layer 14, side faces 16b supported by the core member 19, and a curved surface 16c formed on the side opposite to the second multilayered wiring layer 14.

The bottom surface 16a of the resin portion 16 hermetically seals the entire top surface of the second multilayered wiring layer 14 inside the cavity 20. Furthermore, the side faces 16b of the resin portion 16 seal the core member 19 airtight around the entire periphery of the resin portion 16.

In this configuration, the bottom surface 16a is constrained by the top surface of the second multilayered wiring layer 14, and the side faces 16b are constrained by the core member 19. Therefore, the shape of the resin portion 16 is not prone to change.

Furthermore, the side faces 16b of the resin portion 16 being supported by the core member 19 improves the rigidity of the substrate for embedding an imaging device 10. In other words, the second multilayered wiring layer 14 is susceptible to deformation due to application of a force in the thickness direction of the substrate for embedding an imaging device 10 in the region in which the cavity 20 is formed (where the core layer 12 and the first multilayered wiring layer 13 are not formed). However, the resin portion 16 is integrated with the core member 19 of the core layer 12, thereby reducing the susceptibility of the second multilayered wiring layer 14 to deformation.

This configuration makes the substrate for embedding an imaging device 10 less prone to deformation due to application of forces in the thickness direction thereof, thereby making it possible to reduce the potential for damage and maintain the shape and accurate positioning of the imaging device 11.

The imaging device 11 is adhered along the curved surface 16c of the resin portion 16 using an adhesive 21. The adhesive 21 has a uniform thickness between the imaging device 11 and the resin portion 16. This curves the imaging device 11 into a concave shape that follows the curved surface 16c. In other words, the curved surface 16c of the resin portion 16 supports the imaging device 11 and defines the shape of the imaging device 11.

As described above, the curved shape of the imaging device 11 is a prescribed shape determined according to the configuration of the lens unit 101, and therefore the curved surface 16c of the resin portion 16 is configured appropriately to define that prescribed shape for the imaging device 11. In most cases, the curved surface 16c of the resin portion 16 is formed in the same curved shape that will be used for the imaging device 11.

The imaging device 11 adhered along the curved surface 16c of the resin portion 16 is fully housed within the core layer 12 inside the cavity 20. In this way, the thickness of the substrate for embedding an imaging device 10 does not increase even when the imaging device 11 is curved because a cavity 20 that is capable of fully housing the imaging device 11 is formed.

In conventional substrates, forming a cavity that can house the imaging device 11 decreases the rigidity of the substrate and makes the substrate more prone to deformation or damage. However, the substrate for embedding an imaging device 10 according to the present embodiment is not prone to such deformation or damage even when the cavity 20 is formed because the core member 19 of the core layer 12 provides sufficient rigidity.

Figure 5:
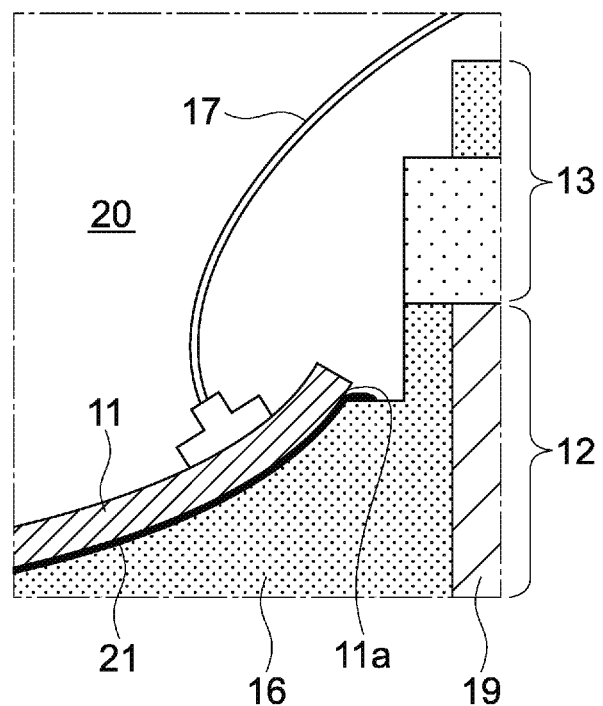
FIG. 5 is an enlarged view of the region enclosed by the dot-dashed line in FIG. 4.

FIG. 5 is an enlarged view of the region enclosed by the dot-dashed line in FIG. 4. The curved surface 16c of the resin portion 16 is formed slightly smaller than the bottom surface of the imaging device 11, and the periphery of the imaging device 11 protrudes out slightly from the curved surface 16c of the resin portion 16. In other words, the bottom surface of the imaging device 11 includes outer edges 11a that protrude from the curved surface 16c.

In this way, when the imaging device 11 is adhered along the curved surface 16c of the resin portion 16, excess adhesive 21 is discharged outside of the outer edges 11a. This prevents excess adhesive 21 from adhering to the sensor surface of the imaging device 11, thereby making it possible to prevent inhibition of detection of external light by the imaging device 11 in the substrate for embedding an imaging device 10.

Comparative Example

Figure 6:
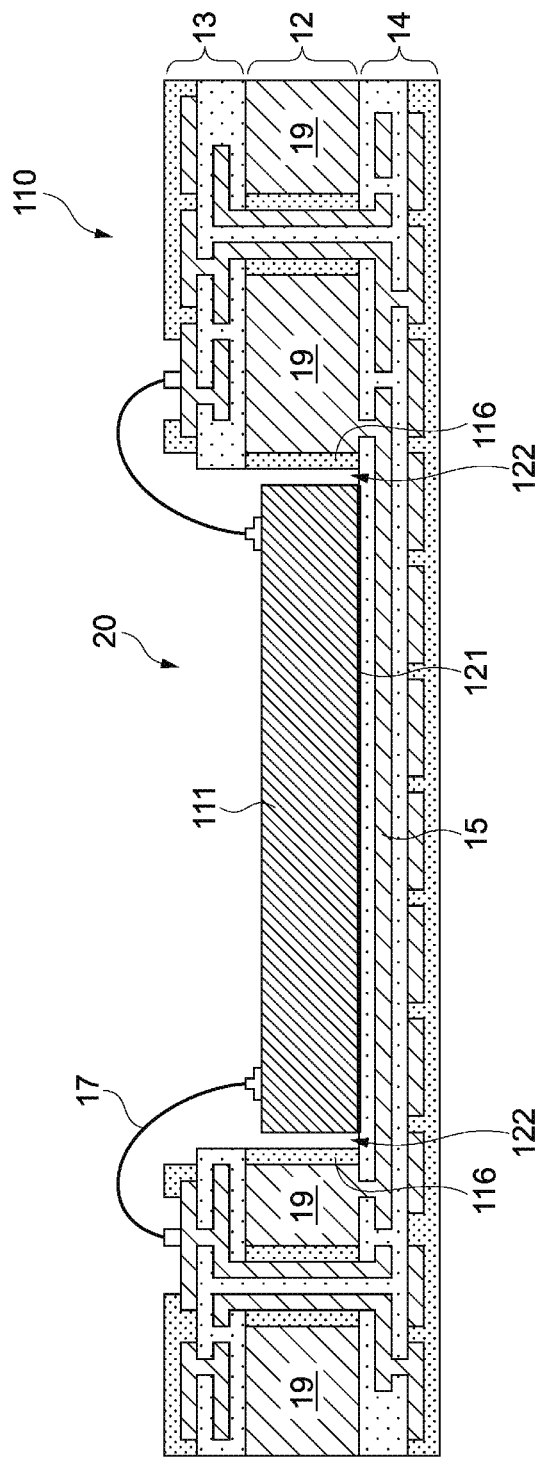
FIG. 6 is a cross-sectional view of a substrate for embedding an imaging device according to a comparative example.

FIG. 6 is a cross-sectional view of a substrate for embedding an imaging device 110 according to a comparative example. Note that the same reference characters are used for components of the substrate for embedding an imaging device 110 that are the same as components used in the substrate for embedding an imaging device 10 according to the abovementioned embodiment, and descriptions of those components are omitted here as appropriate.

The substrate for embedding an imaging device 110 includes a conventional flat plate-shaped imaging device 111. The imaging device 111 is adhered along the bottom surface of a cavity 20 using an adhesive 121. A resin portion 116 is formed separating the imaging device 111 and a core member 19 inside the cavity 20. The resin portion 116 is separated from the imaging device 111, forming a gap 122 between the imaging device 111 and the resin portion 116.

Unlike the substrate for embedding an imaging device 10 according to the embodiment described above, in the substrate for embedding an imaging device 110 the imaging device 111 is not curved. Therefore, when using the substrate for embedding an imaging device 110 the lens unit cannot be made as thin as in the embodiment described above.

Furthermore, unlike the substrate for embedding an imaging device 10 according to the embodiment described above, in the substrate for embedding an imaging device 110 there is the gap 122 between the imaging device 111 and the resin portion 116. As a result, in the substrate for embedding an imaging device 110 a second multilayered wiring layer 14 is more prone to deformation in the region where the gap 122 is formed. In other words, the substrate for embedding an imaging device 110 has lower rigidity than the substrate for embedding an imaging device 10 according to the embodiment described above.

Modification Examples

FIGS. 7A to 7H are cross-sectional views of a substrate for embedding an imaging device 10 according to modification examples of the embodiment described above. Next, these modification examples of the substrate for embedding an imaging device 10 will be described with reference to figures.

(Thickness of Core Layer 12)

In the substrate for embedding an imaging device 10, as long as the imaging device 11 is fully housed within the cavity 20, the same effects as in the embodiment described above can be achieved regardless of the thickness of the core layer 12.

Figure 7A:
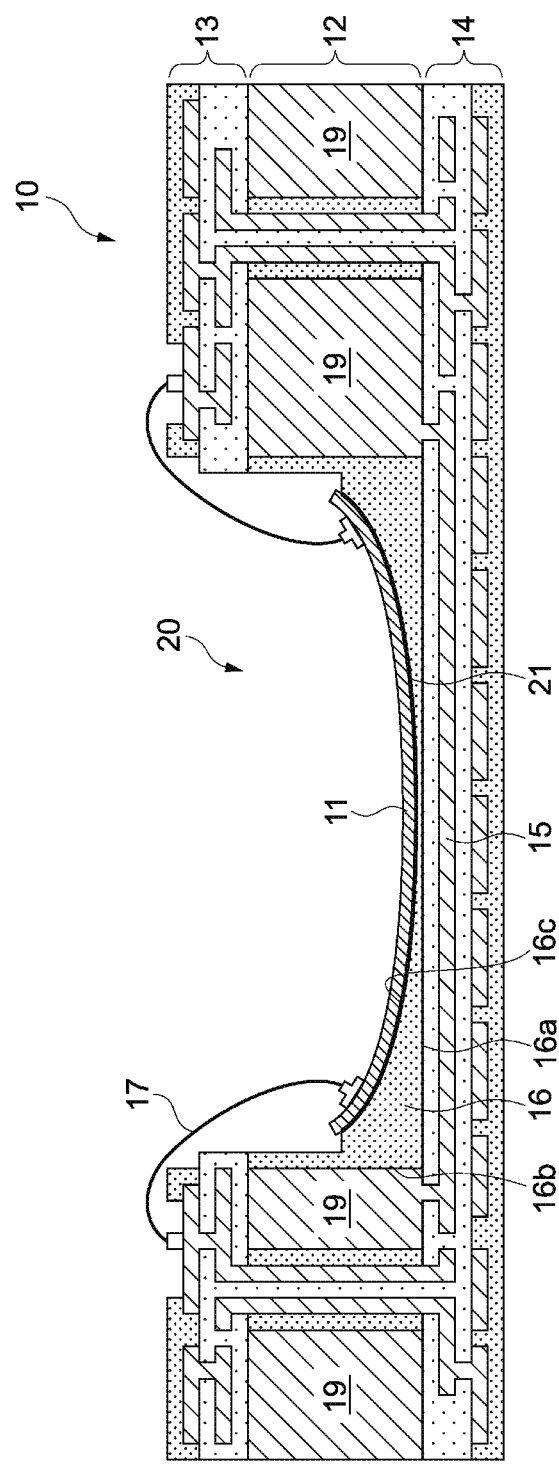
FIG. 7A is a cross-sectional view of a substrate for embedding an imaging device according to a modification example of the abovementioned embodiment.
Figure 7B:
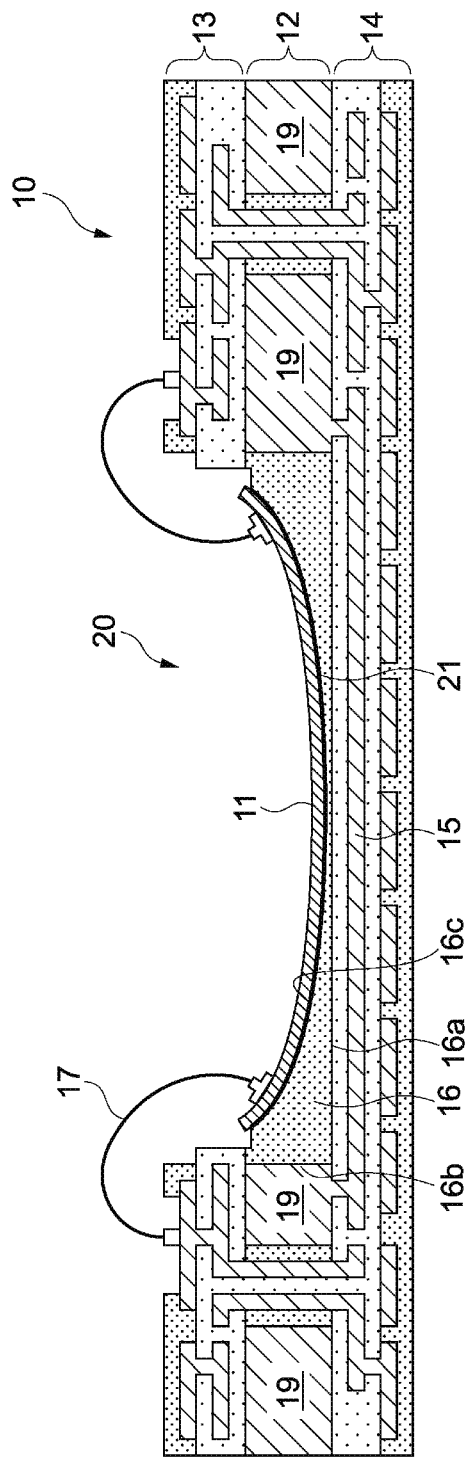
FIG. 7B is a cross-sectional view of a substrate for embedding an imaging device according to a modification example of the abovementioned embodiment.

As illustrated in FIG. 7A, for example, the core layer 12 may be formed thicker than the dimensions of the imaging device 11. Moreover, as illustrated in FIG. 7B, the core layer 12 may be formed more thinly and the periphery of the imaging device 11 may extend into the first multilayered wiring layer 13.

(Size of Curved Surface 16c)

In the substrate for embedding an imaging device 10, the curved surface 16c of the resin portion 16 may be configured in any manner that makes it possible to support the imaging device 11 and define the shape of the imaging device 11.

Figure 7C:
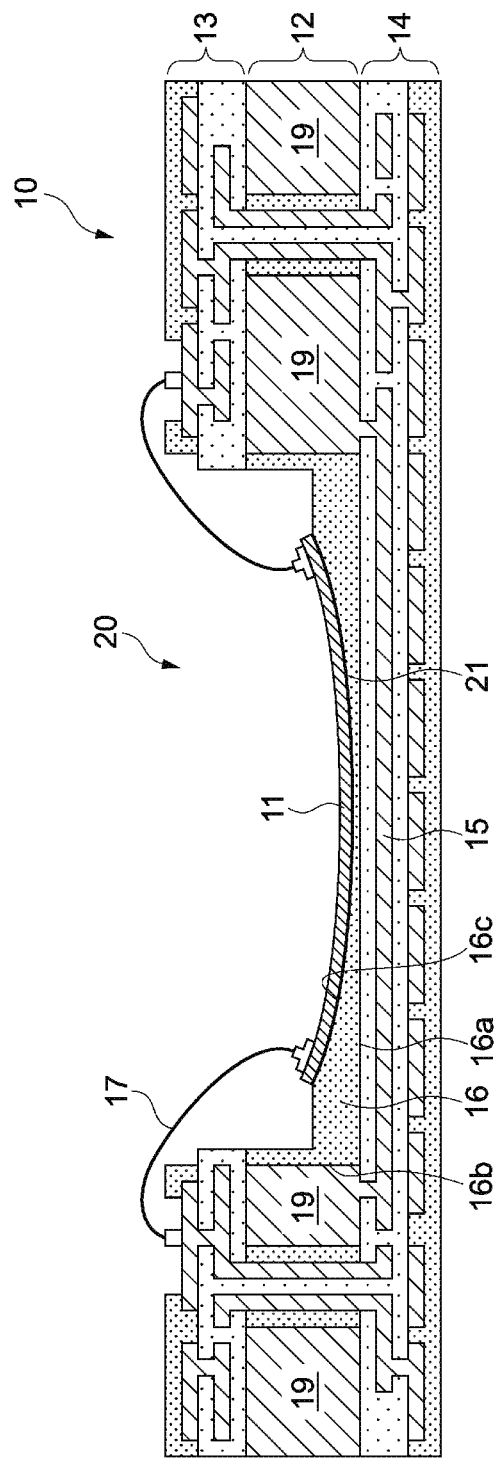
FIG. 7C is a cross-sectional view of a substrate for embedding an imaging device according to a modification example of the abovementioned embodiment.
Figure 7D:
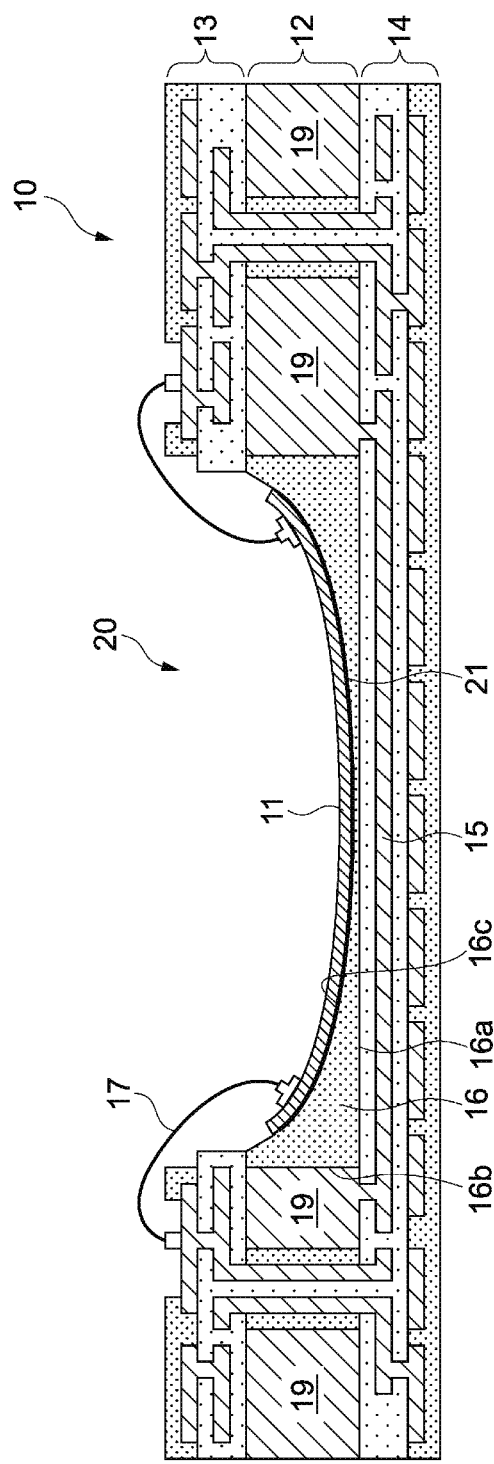
FIG. 7D is a cross-sectional view of a substrate for embedding an imaging device according to a modification example of the abovementioned embodiment.

As illustrated in FIG. 7C, for example, the curved surface 16c of the resin portion 16 may be formed having the same size as the bottom surface of the imaging device 11. Furthermore, as illustrated in FIG. 7D, the curved surface 16c of the resin portion 16 may be formed larger than the bottom surface of the imaging device 11 and may extend to the top surface of the core layer 12, for example.

In these configurations, the ability to prevent excess adhesive 21 from adhering to the sensor surface of the imaging device 11 (as described in reference to FIG. 5) is harder to achieve than in the embodiment described above. However, any potential ill effects due to excess adhesive 21 can still be reduced by optimizing the amount of the adhesive 21 used in order to reduce the amount of excess adhesive 21, for example.

Meanwhile, in these configurations the entire bottom surface of the imaging device 11 is constrained by the curved surface 16c of the resin portion 16, thereby making it possible to more satisfactorily maintain the accurate positioning and shape of the imaging device 11 than in the embodiment described above. Furthermore, the periphery of the imaging device 11 is also supported by the curved surface 16c of the resin portion 16, and therefore the imaging device 11 is less prone to deformation even if the periphery thereof is subjected to shocks or impacts during the wire bonding process.

(Positioning of Imaging Device 11)

In the substrate for embedding an imaging device 10, as long as the imaging device 11 is fully housed within the cavity 20, the same effects as in the embodiment described above can be achieved regardless of the positioning of the imaging device 11.

Figure 7E:
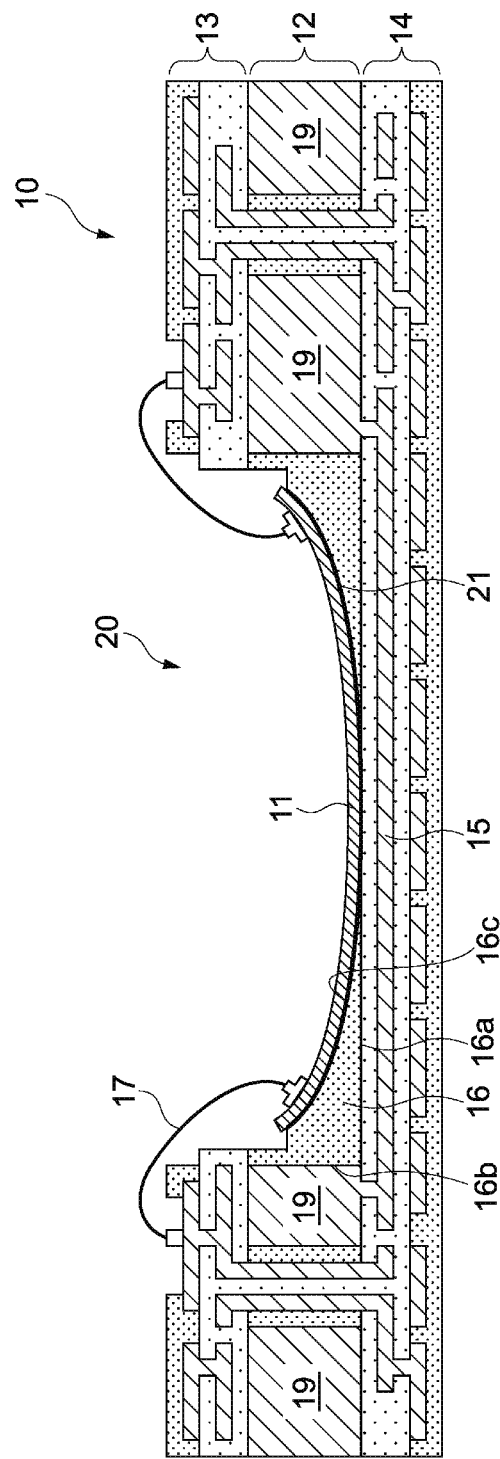
FIG. 7E is a cross-sectional view of a substrate for embedding an imaging device according to a modification example of the abovementioned embodiment.
Figure 7F:
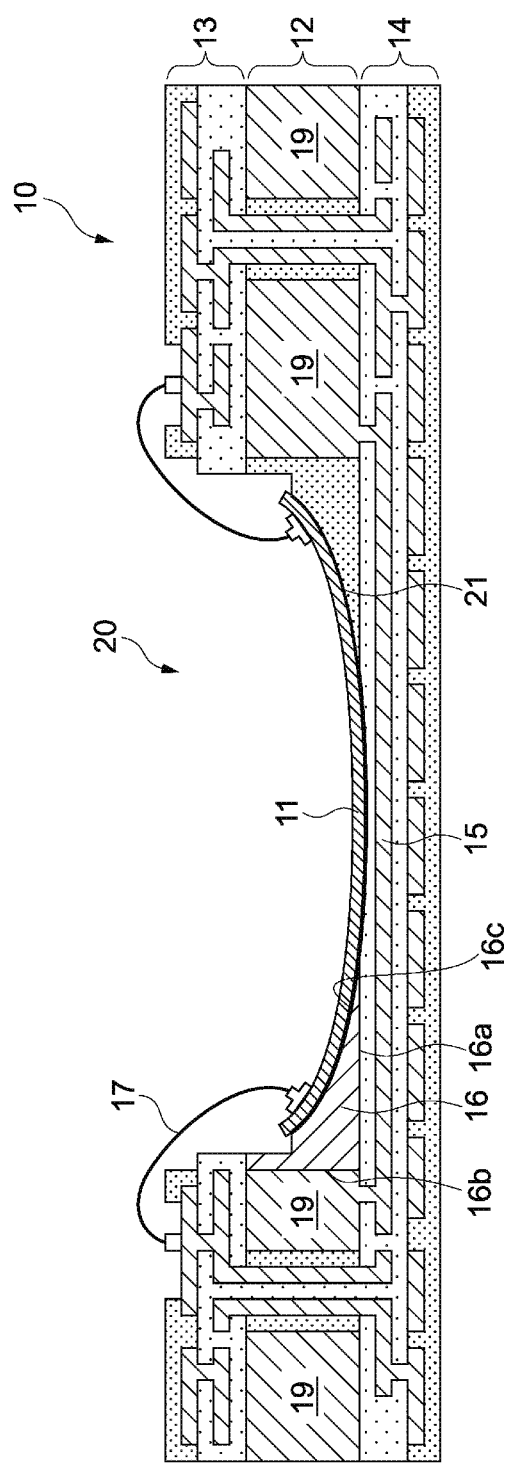
FIG. 7F is a cross-sectional view of a substrate for embedding an imaging device according to a modification example of the abovementioned embodiment.

As illustrated in FIG. 7E, for example, the imaging device 11 may be arranged at a deep position inside the cavity 20, and the center of the bottom surface of the imaging device 11 may contact the top surface of the second multilayered wiring layer 14 (the bottom surface of the cavity 20). Moreover, as illustrated in FIG. 7F, the center of the imaging device 11 may penetrate down into the second multilayered wiring layer 14.

In these configurations, the ability to maintain the curved shape of the imaging device 11 is reduced in comparison to the embodiment described above because the center portion of the imaging device 11 is not supported by the curved surface 16c of the resin portion 16. However, the curved shape of the imaging device 11 can still be sufficiently maintained even in these configurations by using a highly flexible imaging device 11.

Meanwhile, in these configurations the imaging device 11 can be housed at a lower position inside the cavity 20, thereby making it possible to make the core layer 12 thinner. This makes it possible to make the overall substrate for embedding an imaging device 10 even thinner.

(Configuration of Parts of Resin Portion 16 Other than Curved Surface 16c)

The resin portion 16 of the substrate for embedding an imaging device 10 may be configured in any manner that makes it possible for the curved surface 16c to support the imaging device 11 and define the shape of the imaging device 11. The parts of the resin portion 16 other than the curved surface 16c may be modified as appropriate from the configuration described for the abovementioned embodiment.

Figure 7G:
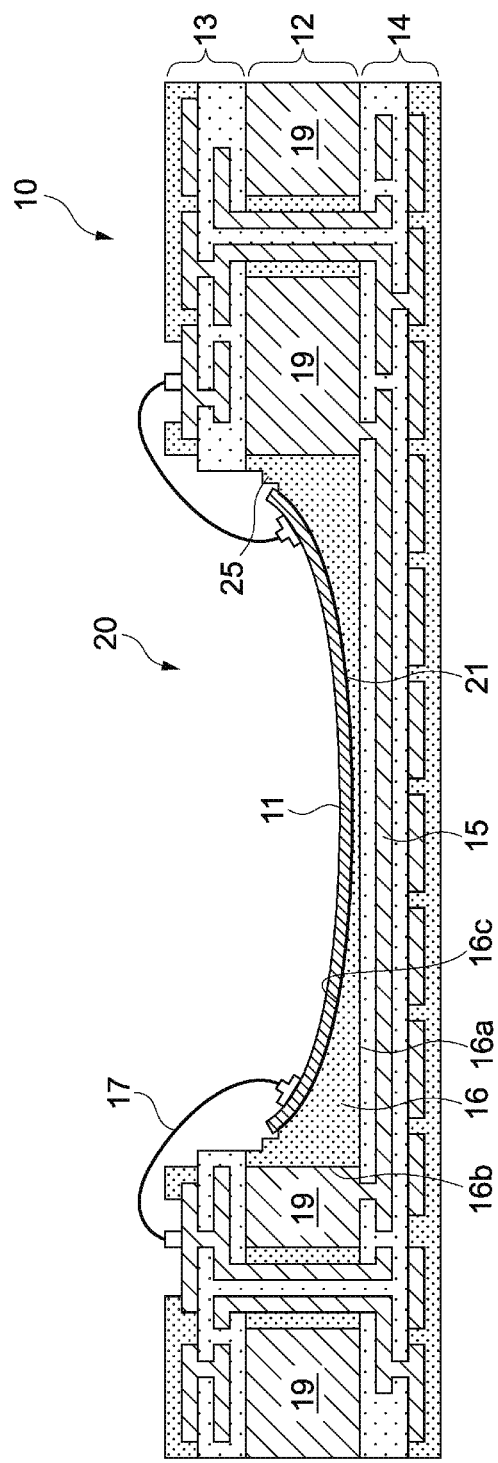
FIG. 7G is a cross-sectional view of a substrate for embedding an imaging device according to a modification example of the abovementioned embodiment.

As illustrated in FIG. 7G, for example, stepped portions 25 may be formed outward of the curved surface 16c in the resin portion 16. However, these stepped portions 25 must be configured to not contact the imaging device 11 so that the stepped portions 25 do not interfere with the adhesion between the imaging device 11 and the curved surface 16c of the resin portion 16.

(Curved Shape of Curved Surface 16c of the Resin Portion 16 and Imaging Device 11)

As described above, in the substrate for embedding an imaging device 10, the curved shape used for the curved surface 16c of the resin portion 16 and the imaging device 11 is determined according to the configuration of the lens unit 101. Therefore, various modifications can be made to the curved shape used for the curved surface 16c of the resin portion 16 and the imaging device 11 depending on the exact configuration used for the lens unit 101.

Figure 7H:
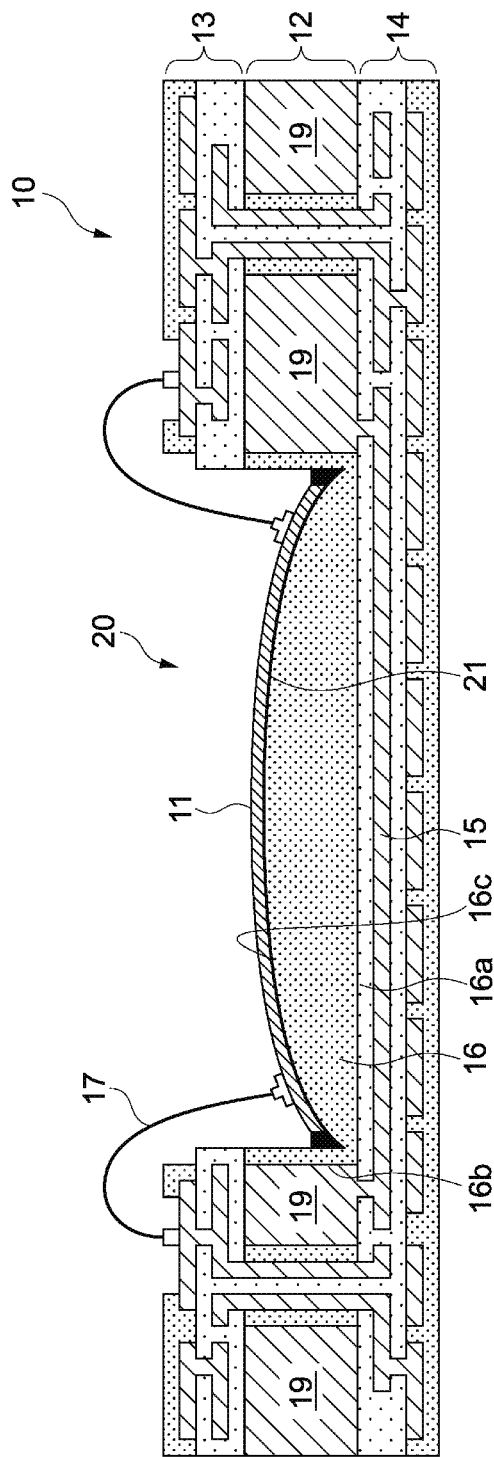
FIG. 7H is a cross-sectional view of a substrate for embedding an imaging device according to a modification example of the abovementioned embodiment.

As illustrated in FIG. 7H, for example, in some cases the curved surface 16c of the resin portion 16 and the imaging device 11 may be curved into a convex shape to suit the configuration of the lens unit 101.

<Methods for Manufacturing Substrate for Embedding Imaging Device 10>

(First Manufacturing Method)

Figure 8:
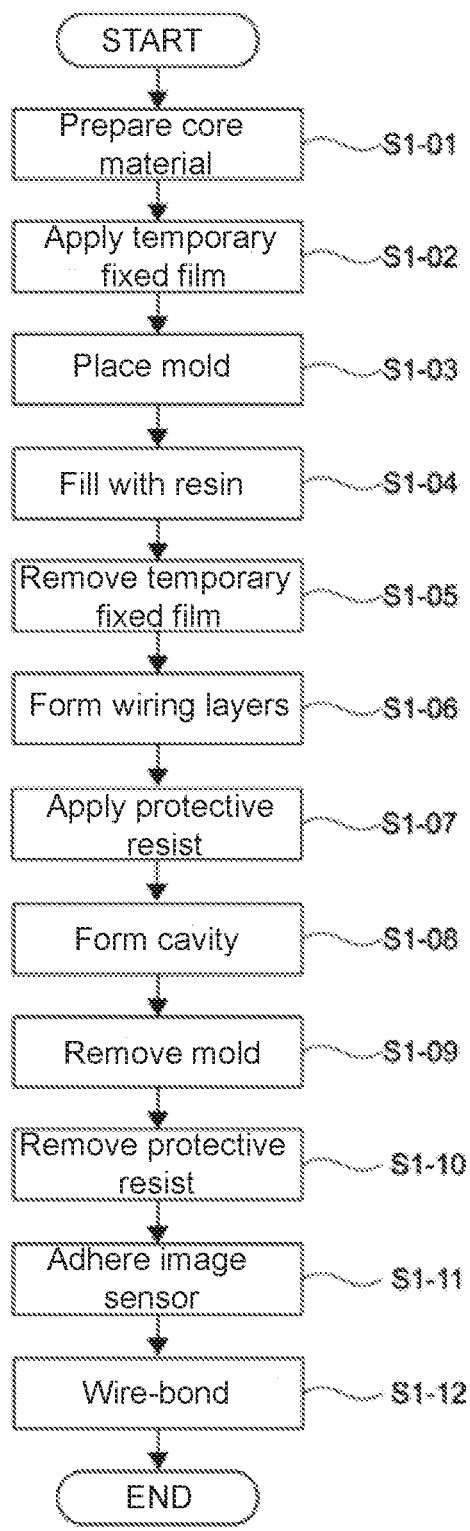
FIG. 8 is a flowchart illustrating a first method for manufacturing the substrate for embedding an imaging device.

FIG. 8 is a flowchart illustrating a first method for manufacturing the substrate for embedding an imaging device 10. FIGS. 9A to 9F and 10A to 10F contain cross-sectional views of the steps in the first method for manufacturing the substrate for embedding an imaging device 10. Next, the first method for manufacturing the substrate for embedding an imaging device 10 will be described following FIG. 8 and with reference to FIGS. 9A to 9F and 10A to 10F.

Step S1-01

Figure 9A:
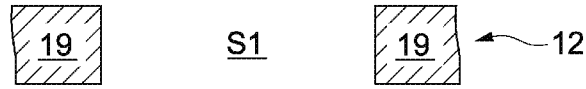
FIGS. 9A to 9F contain cross-sectional views of the steps in the first method for manufacturing the substrate for embedding an imaging device.

As illustrated in FIG. 9A, the core layer 12 is prepared by forming a through-hole S1 corresponding to the cavity 20 in the core member 19.

Step S1-02

Figure 9B:
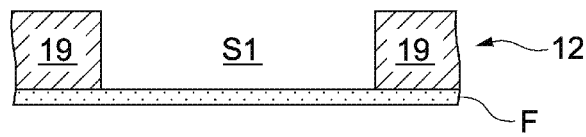

As illustrated in FIG. 9B, a temporary fixed film F is applied to the bottom surface of the core layer 12.

Step S1-03

Figure 9C:
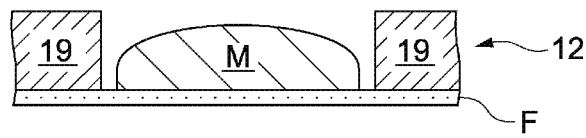

As illustrated in FIG. 9C, a mold M for forming the curved surface 16c of the resin portion 16 is placed inside the through-hole S1 with the convex curved surface facing upwards and then adhered along the temporary fixed film F.

Step S1-04

Figure 9D:
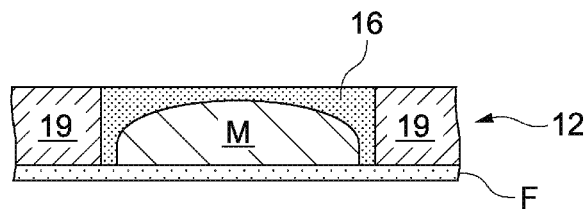

As illustrated in FIG. 9D, a resin is filled into the through-hole S1 and then hardened to form the resin portion 16. Note that the mold M from step S1-03 may also be positioned after the through-hole S1 is filled with the resin but before the resin is hardened to form the resin portion 16.

Step S1-05

Figure 9E:
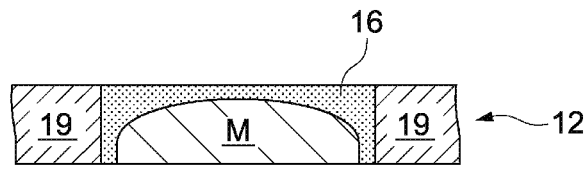

As illustrated in FIG. 9E, the temporary fixed film F is removed from the core layer 12.

Step S1-06

Figure 9F:
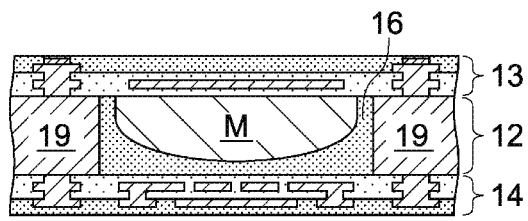

As illustrated in FIG. 9F, the core layer 12 is flipped upside down, the first multilayered wiring layer 13 is formed on the top surface of the core layer 12, and the second multilayered wiring layer 14 is formed on the bottom surface of the core layer 12.

Step S1-07

Figure 10A:
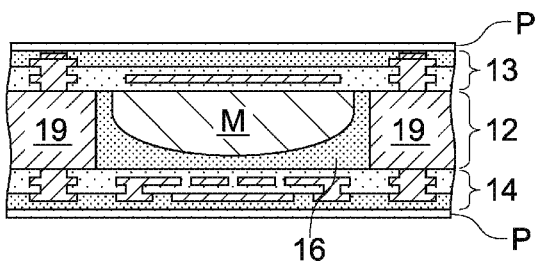
FIGS. 10A to 10F contain cross-sectional views of the steps in the first method for manufacturing the substrate for embedding an imaging device.

As illustrated in FIG. 10A, a protective resist P is applied to the top surface of the first multilayered wiring layer 13 and to the bottom surface of the second multilayered wiring layer 14.

Step S1-08

Figure 10B:
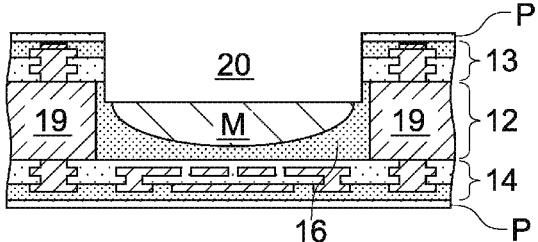

As illustrated in FIG. 10B, the cavity 20 is formed in the first multilayered wiring layer 13 and the core layer 12.

Step S1-09

Figure 10C:
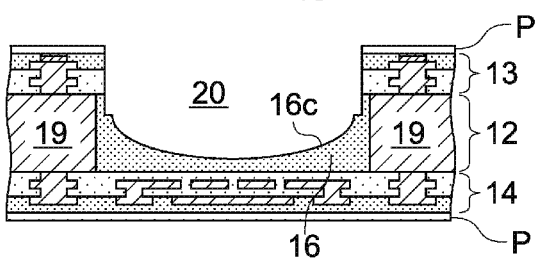

As illustrated in FIG. 10C, the mold M is removed from the cavity 20 using an etching process, thereby exposing the curved surface 16c of the resin portion 16.

Step S1-10

Figure 10D:
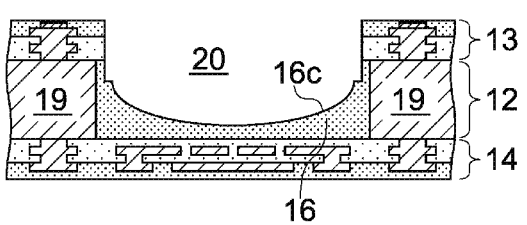

As illustrated in FIG. 10D, the protective resist P is removed from the first multilayered wiring layer 13 and the second multilayered wiring layer 14.

Step S1-11

Figure 10E:
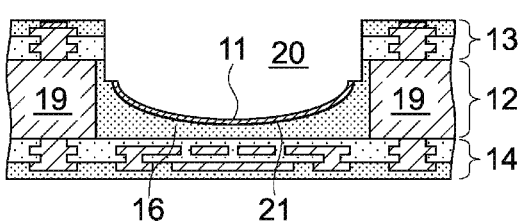

As illustrated in FIG. 10E, the imaging device 11 is adhered along the curved surface 16c of the resin portion 16 using the adhesive 21.

Step S1-12

Figure 10F:
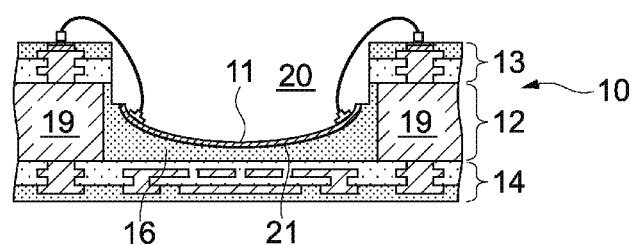

As illustrated in FIG. 10F, the imaging device 11 and the first multilayered wiring layer 13 are wire-bonded to connect them together, thereby completing the substrate for embedding an imaging device 10.

In the first manufacturing method as described above, using the mold M makes it possible to easily and accurately form the curved surface 16c of the resin portion 16. The mold M may be configured in any manner as long as the mold M includes a curved surface for forming the curved surface 16c of the resin portion 16 and is not limited to the shape depicted in the figures. The mold M may have a flat surface with a curved surface formed on the outer side of that flat surface, for example.

(Second Manufacturing Method)

Figure 11:
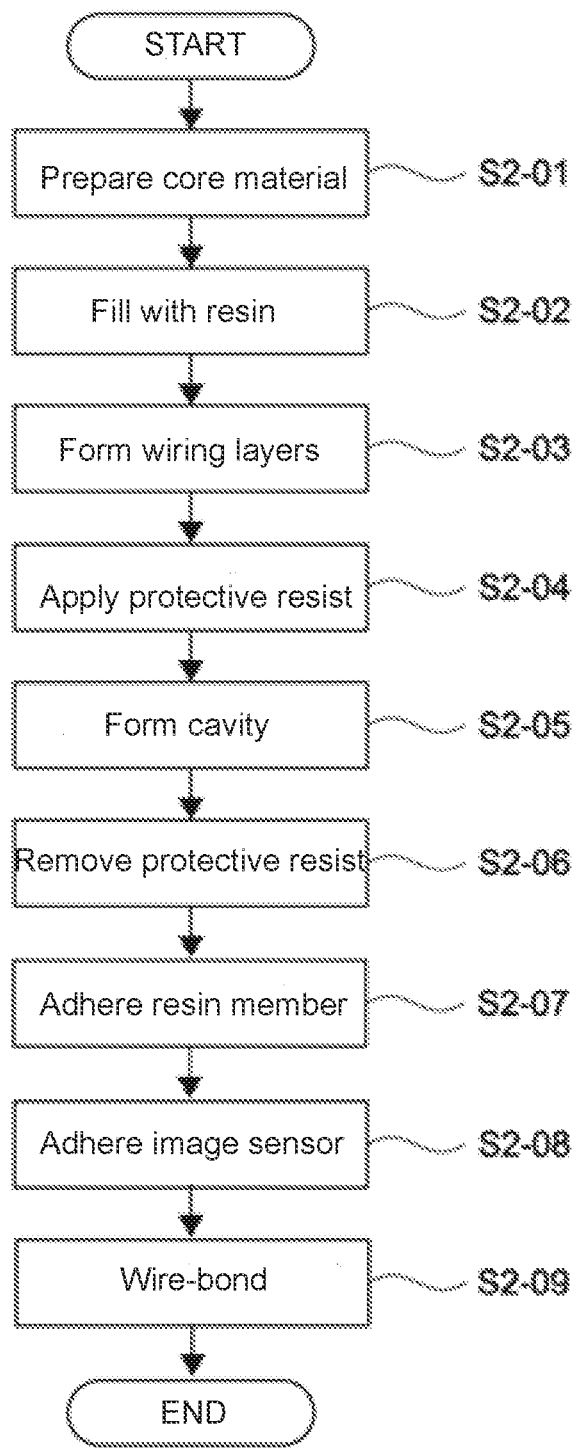
FIG. 11 is a flowchart illustrating a second method for manufacturing the substrate for embedding an imaging device.

FIG. 11 is a flowchart illustrating a second method for manufacturing the substrate for embedding an imaging device 10. FIGS. 12A to 12D and 13A to 13D contain cross-sectional views of the steps in the second method for manufacturing the substrate for embedding an imaging device 10. Next, the second method for manufacturing the substrate for embedding an imaging device 10 will be described following FIG. 11 and with reference to FIGS. 12A to 12D and 13A to 13D.

Step S2-01

Figure 12A:
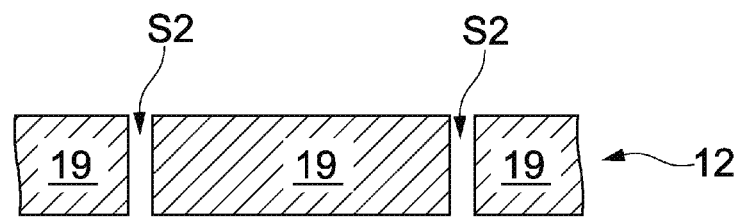
FIGS. 12A to 12D contain cross-sectional views of the steps in the second method for manufacturing the substrate for embedding an imaging device.

As illustrated in FIG. 12A, the core layer 12 is prepared by forming through-holes S2 corresponding to the periphery of the cavity 20 in the core member 19.

Step S2-02

Figure 12B:
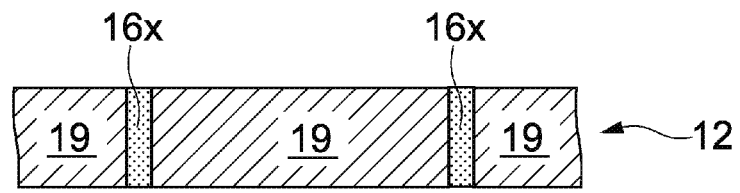

As illustrated in FIG. 12B, a resin 16x is filled into the through-holes S2 and then hardened.

Steps S2-03, S2-04

Figure 12C:
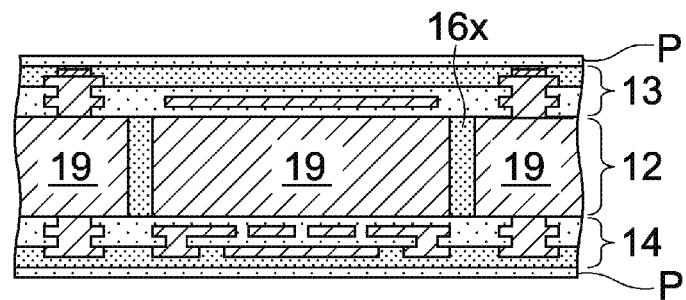

As illustrated in FIG. 12C, the first multilayered wiring layer 13 is formed on the top surface of the core layer 12, and the second multilayered wiring layer 14 is formed on the bottom surface of the core layer 12. Then, a protective resist P is applied to the top surface of the first multilayered wiring layer 13 and to the bottom surface of the second multilayered wiring layer 14.

Step S2-05

Figure 12D:
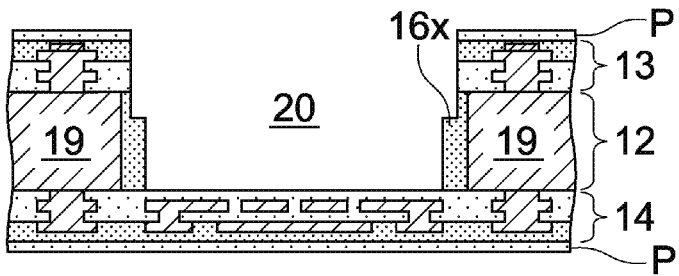

As illustrated in FIG. 12D, the cavity 20 is formed in the first multilayered wiring layer 13 and the core layer 12.

Step S2-06

Figure 13A:
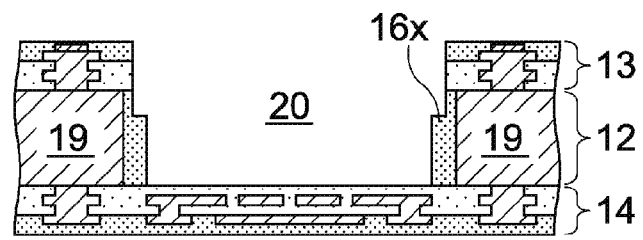
FIGS. 13A to 13D contain cross-sectional views of the steps in the second method for manufacturing the substrate for embedding an imaging device.

As illustrated in FIG. 13A, the protective resist P is removed from the first multilayered wiring layer 13 and the second multilayered wiring layer 14.

Step S2-07

Figure 13B:
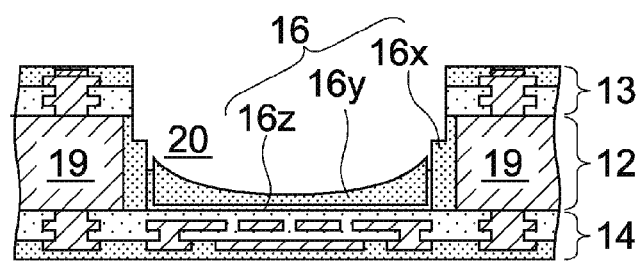

As illustrated in FIG. 13B, a resin member 16y with a curved surface 16c is placed inside the cavity 20 and adhered along the second multilayered wiring layer 14 and the resin 16x using an adhesive 16z. Together, the resin 16x, the resin member 16y, and the adhesive 16z form the resin portion 16.

Step S2-08

Figure 13C:
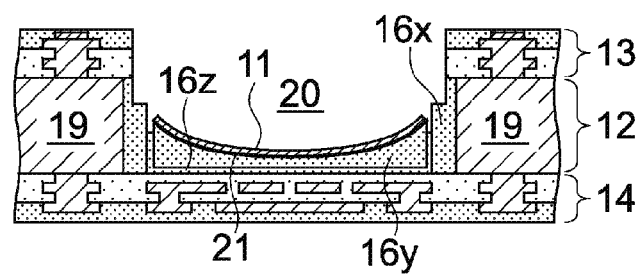

As illustrated in FIG. 13C, the imaging device 11 is adhered along the curved surface 16c of the resin member 16y using the adhesive 21.

Step S2-09

Figure 13D:
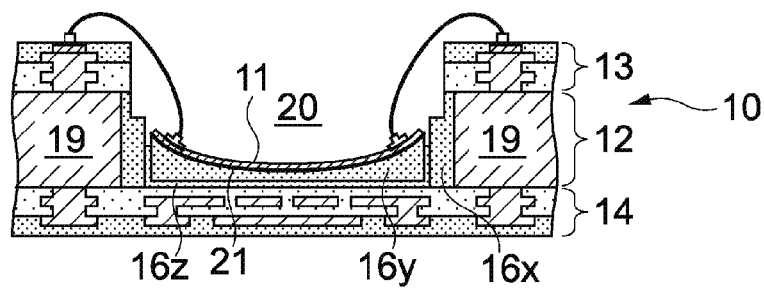

As illustrated in FIG. 13D, the imaging device 11 and the first multilayered wiring layer 13 are wire-bonded to connect them together, thereby completing the substrate for embedding an imaging device 10.

In the second manufacturing method as described above, the resin member 16y with the curved surface 16c is prepared in advance, thereby making it possible to manufacture the substrate for embedding an imaging device 10 using a simpler process.

Figure 14:
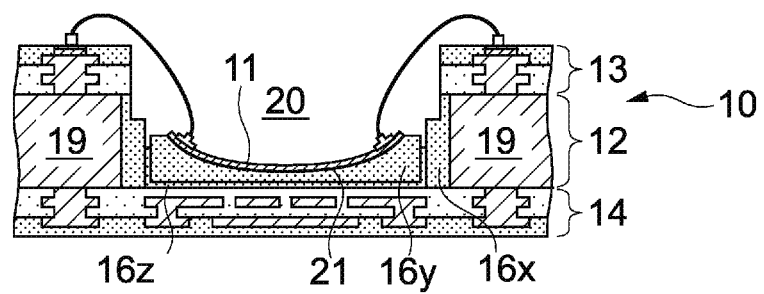
FIG. 14 is a cross-sectional view illustrating a modification example of a substrate for embedding an imaging device manufactured using the second manufacturing method.

The shape of the resin member 16y used in the second manufacturing method may be determined as appropriate. As in the substrate for embedding an imaging device 10 illustrated in FIG. 14, for example, flat surfaces may be formed outside of the curved surface 16c in the resin member 16y.

Embodiments of the present invention were described above. However, the present invention is not limited to the embodiments described above, and various modifications may be made without departing from the spirit of the invention.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A substrate for embedding an imaging device, comprising:
    a core layer;
    a first multilayered wiring layer that is formed onto the core layer, the core layer and the first multilayered wiring layer having a cavity penetrating therethrough;
    a second multilayered wiring layer that is formed onto the core layer on a side opposite to the first multilayered wiring layer and that includes a conductive pattern formed at a position facing the cavity;
    a resin portion that is arranged inside the cavity and includes a bottom surface supported by and directly connected to the second multilayered wiring layer, a side face supported by and directly connected to the core layer, and a curved surface formed on a side opposite to the bottom surface; and
    an imaging device adhered along the curved surface inside the cavity.

2. The substrate for embedding the imaging device according to claim 1, wherein the curved surface of the resin portion curves towards the second multilayered wiring layer.

3. The substrate for embedding the imaging device according to claim 1, wherein the imaging device protrudes out beyond the curved surface of the resin portion.

4. The substrate for embedding the imaging device according to claim 1, wherein the curved surface of the resin portion protrudes out beyond the imaging device.

5. The substrate for embedding the imaging device according to claim 1, wherein the cavity is hermetically sealed by the second multilayered wiring layer.

6. The substrate for embedding the imaging device according to claim 1, wherein the core layer is made of metal, and
wherein the conductive pattern of the second multilayered wiring layer is electrically connected to the core layer.

7. An imaging apparatus, comprising:
a lens unit configured to transmit external light;
a core layer that is arranged facing the lens unit;
a first multilayered wiring layer that is formed onto a lens unit side of the core layer, said core layer and said first multilayered wiring layer having a cavity penetrating therethrough;
a second multilayered wiring layer that is formed onto the core layer on a side opposite to the first multilayered wiring layer and that includes a conductive pattern formed at a position facing the cavity;
a resin portion that is arranged inside the cavity and includes a bottom surface supported by and directly connected to the second multilayered wiring layer, a side face supported by and directly connected to the core layer, and a curved surface that is formed on a side opposite to the bottom surface and has a shape determined according to a configuration of the lens unit; and
an imaging device adhered along the curved surface inside the cavity that receives the external light passing through the lens unit.

8. The imaging apparatus according to claim 7, wherein the core layer is made of metal.

* * * * *